US012733544B2

(12) United States Patent
Ko et al.

(10) Patent No.: US 12,733,544 B2
(45) Date of Patent: Sep. 8, 2026

(54) LIGHT EMITTING MODULE INCLUDING LIGHT EMITTER WITH SHAPED P-TYPE SEMICONDUCTOR LAYER

(71) Applicant: SEOUL VIOSYS CO., LTD., Gyeonggi-do (KR)

(72) Inventors: MiSo Ko, Gyeonggi-do (KR); EunMi Choi, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 527 days.

(21) Appl. No.: 18/140,072

(22) Filed: Apr. 27, 2023

(65) Prior Publication Data

US 2023/0402434 A1 Dec. 14, 2023

Related U.S. Application Data

(60) Provisional application No. 63/336,186, filed on Apr. 28, 2022.

(51) Int. Cl.
*H10W 90/00* (2026.01)
*H10H 20/857* (2025.01)

(52) U.S. Cl.
CPC .......... *H10W 90/00* (2026.01); *H10H 20/857* (2025.01)

(58) Field of Classification Search
CPC .. H01L 25/0753; H01L 25/167; H10W 90/00; H10B 80/00; H10K 39/10;
(Continued)

(56) References Cited

U.S. PATENT DOCUMENTS

2003/0151357 A1* 8/2003 Uemura ............... H10H 20/813
313/506
2011/0309390 A1 12/2011 Liu et al.
(Continued)

FOREIGN PATENT DOCUMENTS

DE 102017102112 A1 8/2017
JP 2011-204659 A 10/2011
(Continued)

OTHER PUBLICATIONS

International Search Report for PCT Application No. PCT/KR2023/005903 (English translation not available), Aug. 11, 2023, 4 pages.
(Continued)

*Primary Examiner* — Eliseo Ramos Feliciano
*Assistant Examiner* — Mikka Liu
(74) *Attorney, Agent, or Firm* — LaBatt, LLC

(57) ABSTRACT

According to one aspect of the present disclosure, there may be provided a light-emitting module, including: a base substrate; and a plurality of light emitting elements disposed on the base substrate to generate light, wherein the plurality of light emitting elements include: a first light emitting element for generating light having a first peak wavelength and a first dominant wavelength; and a second light emitting element for generating light having a second peak wavelength and a second dominant wavelength, and wherein a first absolute value, which is an absolute value of the difference between the first peak wavelength and the first dominant wavelength, is smaller than a second absolute value, which is an absolute value of the difference between the second peak wavelength and the second dominant wavelength.

20 Claims, 10 Drawing Sheets

(58) Field of Classification Search
CPC ........ H10K 59/90; H10K 59/95; H10N 19/00; H10N 39/00; H10N 59/00; H10N 69/00; H10N 79/00; H10N 89/00
USPC ...................................................... 257/88–89
See application file for complete search history.

(56) References Cited

U.S. PATENT DOCUMENTS

| | | | | |
|---|---|---|---|---|
| 2012/0008318 | A1 | 1/2012 | Ishiwata et al. | |
| 2012/0091478 | A1 | 4/2012 | Lee et al. | |
| 2017/0205565 | A1 | 7/2017 | Akagawa et al. | |
| 2017/0263820 | A1* | 9/2017 | Lu | H10H 20/811 |
| 2020/0091248 | A1 | 3/2020 | Lin et al. | |
| 2020/0373469 | A1* | 11/2020 | Chen | H01L 25/0753 |
| 2022/0037556 | A1 | 2/2022 | Cho et al. | |
| 2022/0302357 | A1 | 9/2022 | Cheng et al. | |

FOREIGN PATENT DOCUMENTS

| | | | |
|---|---|---|---|
| JP | 6447524 | B2 | 1/2019 |
| KR | 10-1171331 | B1 | 8/2012 |

OTHER PUBLICATIONS

Extended European Search Report for European Patent Application No. 23796891.2, Mar. 31, 2026, 12 pages.

* cited by examiner

LIGHT EMITTING MODULE INCLUDING LIGHT EMITTER WITH SHAPED P-TYPE SEMICONDUCTOR LAYER

CROSS-REFERENCE TO RELATED APPLICATIONS AND PRIORITY

The present application claims priority to and the benefit of U.S. Provisional Application No. 63/336,186, filed on Apr. 28, 2022, which is incorporated by reference for all purposes as if fully set forth herein.

TECHNICAL FIELD

The present disclosure relates to a light-emitting module and a display device including the same.

BACKGROUND OF INVENTION

A display device is a device that displays characters, symbols, images, or images. The display device includes a plurality of light-emitting modules, and the light-emitting module includes a plurality of light emitting elements that emit light, and the plurality of light emitting elements may emit the same color or different colors. The display device may control light emitted from the plurality of light emitting elements to display text, symbols, images, or videos.

The display device includes a display substrate such as a PCB substrate on which an electric circuit is disposed, and the plurality of light-emitting modules are disposed on the display substrate to be connected to the electric circuit.

In a conventional display device, since the plurality of light emitting elements are not firmly and reliably connected to the display substrate, display of characters, symbols, images, or videos may not be smooth.

CONTENTS OF INVENTION

Problems to be Solved by Invention

Embodiments of the present disclosure have been conceived in view of the above, and provide a light-emitting module in which a plurality of light emitting elements can be firmly and reliably connected to a display substrate and a display device including the light-emitting module.

Means for Solving Problems

In accordance with an aspect of the present disclosure, there is provided a light-emitting module, including: a base substrate; and a plurality of light emitting elements disposed on the base substrate to generate light, wherein the plurality of light emitting elements include: a first light emitting element for generating light having a first peak wavelength and a first dominant wavelength; and a second light emitting element for generating light having a second peak wavelength and a second dominant wavelength, and wherein a first absolute value, which is an absolute value of the difference between the first peak wavelength and the first dominant wavelength, is smaller than a second absolute value, which is an absolute value of the difference between the second peak wavelength and the second dominant wavelength.

Further, there may be provided the light-emitting module wherein the second peak wavelength is greater than the first peak wavelength, and the second dominant wavelength is greater than the first dominant wavelength.

Further, there may be provided the light-emitting module wherein the plurality of light emitting elements further include a third light emitting element for generating light having a third peak wavelength and a third dominant wavelength, the third peak wavelength is greater than the second peak wavelength, and the third dominant wavelength is greater than the second dominant wavelength, and a third absolute value, which is an absolute value of the difference between the third peak wavelength and the third dominant wavelength, is greater than the second absolute value.

Further, there may be provided the light-emitting module wherein the first absolute value is a value in a range of 1 nm to 10 nm, the second absolute value is a value in a range of 5 nm to 15 nm, and the third absolute value is a value in a range of 5 nm to 30 nm, Further, there may be provided the light-emitting module further including a molding layer covering the plurality of light emitting elements, wherein the first peak wavelength and the first dominant wavelength are measured values for light generated in the first light emitting element and transmitted through the molding layer, the second peak wavelength and the second dominant wavelength are measured values for light generated in the second light emitting element and transmitted through the molding layer, and the third peak wavelength and the third dominant wavelength are measured values for light generated in the third light emitting element and transmitted through the molding layer.

Further, there may be provided the light-emitting module wherein the first light emitting element includes a first P-type semiconductor layer and a first N-type semiconductor layer sequentially stacked from the base substrate, wherein the second light emitting element includes a second P-type semiconductor layer and a second N-type semiconductor layer sequentially stacked from the base substrate, and wherein the first N-type semiconductor layer has a larger area than the first P-type semiconductor layer, and the second N-type semiconductor layer has a larger area than the second P-type semiconductor layer.

Further, there may be provided the light-emitting module wherein the area of the first N-type semiconductor layer is larger than that of the second N-type semiconductor layer.

Further, there may be provided the light-emitting module wherein the area difference between the first N-type semiconductor layer and the first P-type semiconductor layer is greater than the area difference between the second N-type semiconductor layer and the second P-type semiconductor layer.

Further, there may be provided the light-emitting module wherein when the first light emitting element is viewed from an up-down direction, an edge of the first P-type semiconductor layer includes four linear portions extending in a straight line, and three or more round portions disposed between the four linear portions and having a convexly curved shape, and the linear portions and the round portions are alternately arranged along the edge of the first P-type semiconductor layer.

Further, there may be provided the light-emitting module wherein the plurality of light emitting elements further include a third light emitting element for generating light having a third peak wavelength and a third dominant wavelength, and wherein when the first light emitting element and the third light emitting element are viewed in the up-down direction, the number of the round portions of the edge of the first P-type semiconductor layer is three, the edge of the first P-type semiconductor layer includes a corner recess portion disposed between any two linear portions among the four linear portions and having a concavely curved shape, and an edge of the third P-type semiconductor layer includes four linear portions extending in a straight line, four round portions disposed between the four linear portions and having a convexly curved shape, and a groove portion formed on any one of the four linear portions and having a shape concavely depressed toward a center of the third P-type semiconductor layer.

Further, there may be provided the light-emitting module wherein the first light emitting element further includes a first element substrate stacked on the first N-type semiconductor layer, and when the first light emitting element is viewed in an up-down direction, an edge of the first element substrate is spaced apart from an edge of the first N-type semiconductor layer and surrounds the edge of the first N-type semiconductor layer.

Further, there may be provided the light-emitting module wherein the second light emitting element further includes a second element substrate stacked on the second N-type semiconductor layer, and when viewed in the up-down direction, the smaller one of the first element substrate and the second element substrate has a size of 90% or more of the larger one of the first element substrate and the second element substrate.

Further, there may be provided the light-emitting module wherein the first light emitting element further includes a first N-type electrode electrically connected to the first N-type semiconductor layer and a first P-type electrode electrically connected to the first P-type semiconductor layer, and one of the first N-type electrode and the first P-type electrode has a first extension part extending horizontally in one direction, Further, there may be provided the light-emitting module wherein the second light emitting element further includes a second N-type electrode electrically connected to the second N-type semiconductor layer and a second P-type electrode electrically connected to the second P-type semiconductor layer, and one of the second N-type electrode and the second P-type electrode has a second extension part extending horizontally in another direction different from the one direction, Further, there may be provided a light-emitting module including: a base substrate; and a plurality of light emitting elements disposed on the base substrate to generate light, wherein the plurality of light emitting elements include: a first light emitting element for generating light having a first peak wavelength and a first dominant wavelength; a second light emitting element for generating light having a second peak wavelength and a second dominant wavelength; and a third light emitting element for generating light having a third peak wavelength and a third dominant wavelength, and wherein a first peak difference value, which is an absolute value of the difference between the second peak wavelength and the first peak wavelength, is smaller than a second peak difference value, which is an absolute value of the difference between the third peak wavelength and the second peak wavelength, and wherein the second peak wavelength is greater than the first peak wavelength, and the third peak wavelength is greater than the second peak wavelength.

Further, there may be provided the light-emitting module wherein a first dominant difference value, which is an absolute value of the difference between the second dominant wavelength and the first dominant wavelength, is greater than the first peak difference value.

Further, there may be provided the light-emitting module wherein a second dominant difference value, which is an absolute value of the difference between the third dominant wavelength and the second dominant wavelength, is smaller than the second peak difference value.

Further, there may be provided the light-emitting module wherein a third dominant difference value, which is an absolute value of the difference between the third dominant wavelength and the first dominant wavelength, is smaller than a third peak difference value, which is an absolute value of the difference between the third peak wavelength and the first peak wavelength.

Further, there may be provided a light-emitting module including: a base substrate; and a plurality of light emitting elements disposed on the base substrate to generate light, wherein the plurality of light emitting elements include: a first light emitting element for generating light having a first peak wavelength and a first dominant wavelength; a second light emitting element for generating light having a second peak wavelength and a second dominant wavelength; and a third light emitting element for generating light having a third peak wavelength and a third dominant wavelength, wherein a first dominant difference value, which is an absolute value of the difference between the second dominant wavelength and the first dominant wavelength, is smaller than a second dominant difference value, which is an absolute value of the difference between the third dominant wavelength and the second dominant wavelength, and wherein the second dominant wavelength is greater than the first dominant wavelength, and the third dominant wavelength is greater than the second dominant wavelength.

Further, there may be provided a display device including: a display substrate on which an electric circuit is disposed; and a plurality of light emitting modules disposed on the display substrate to be electrically connected to the electric circuit, wherein each of the light-emitting modules includes: a base substrate; and a plurality of light emitting elements disposed on the base substrate to generate light, wherein the plurality of light emitting elements include: a first light emitting element for generating light having a first peak wavelength and a first dominant wavelength; and a second light emitting element for generating light having a second peak wavelength and a second dominant wavelength, and wherein a first absolute value, which is an absolute value of the difference between the first peak wavelength and the first dominant wavelength, is smaller than a second absolute value, which is an absolute value of the difference between the second peak wavelength and the second dominant wavelength.

Effects of Invention

According to embodiments of the present disclosure, the plurality of light-emitting modules can be firmly and reliably connected to the display substrate.

Further, according to embodiments of the present disclosure, characters, symbols, images, or videos can be displayed smoothly.

DETAILED DESCRIPTION FOR EMBODYING INVENTION

Hereinafter, specific embodiments for implementing a spirit of the present disclosure will be described in detail with reference to the drawings.

In describing the present disclosure, detailed descriptions of known configurations or functions may be omitted to clarify the present disclosure.

When an element is referred to as being 'connected' to, 'supported' by, 'disposed' on, or 'stacked' on another element, it should be understood that the element may be directly connected to, supported by, disposed on, or stacked on another element, but that other elements may exist in the middle.

The terms used in the present disclosure are only used for describing specific embodiments, and are not intended to limit the present disclosure. Singular expressions include plural expressions unless the context clearly indicates otherwise.

Further, in the present disclosure, it is to be noted that expressions, such as the upper side and the lower side, are described based on the illustration of drawings, but may be modified if directions of corresponding objects are changed. For the same reasons, some components are exaggerated, omitted, or schematically illustrated in the accompanying drawings, and the size of each component does not fully reflect the actual size.

Terms including ordinal numbers, such as first and second, may be used for describing various elements, but the corresponding elements are not limited by these terms. These terms are only used for the purpose of distinguishing one element from another element.

In the present specification, it is to be understood that the terms such as "including" are intended to indicate the existence of the certain features, areas, integers, steps, actions, elements, combinations, and/or groups thereof disclosed in the specification, and are not intended to preclude the possibility that one or more other certain features, areas, integers, steps, actions, elements, combinations, and/or groups thereof may exist or may be added. Hereinafter, a light-emitting module according to a first embodiment of the present disclosure and a display device 1 including the same will be described with reference to the drawings.

Figure 1:
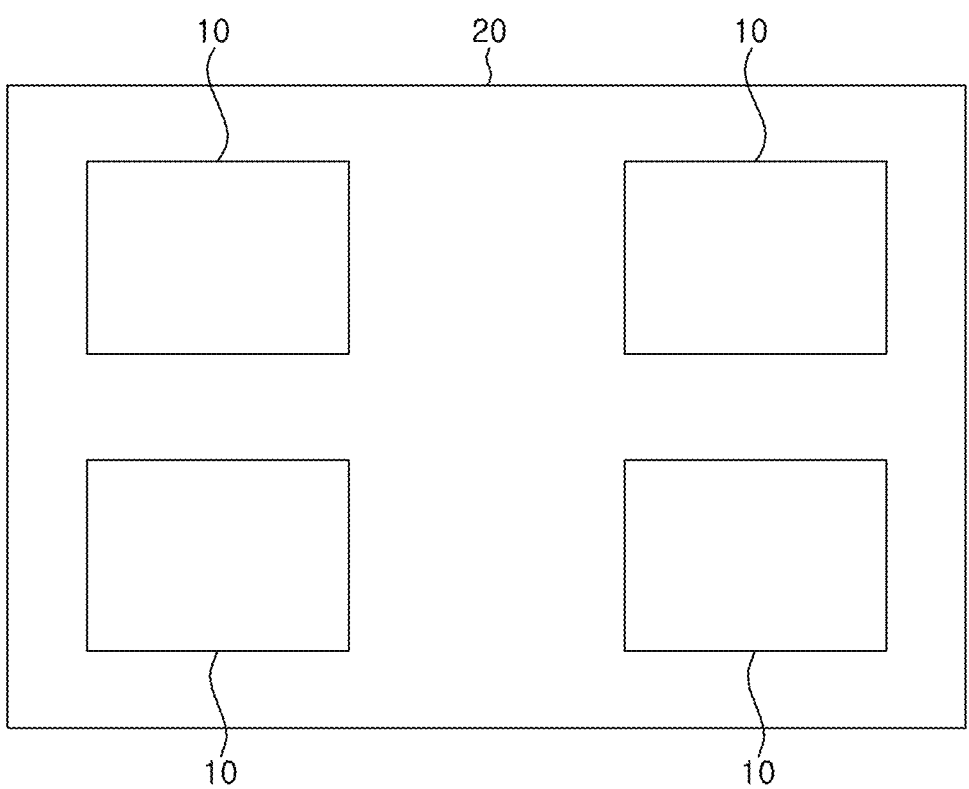
FIG. 1 is a plan view illustrating a display device according to a first embodiment of the present disclosure.

Referring to FIG. 1, the display device 1 according to the first embodiment of the present disclosure can display text, symbols, images or videos. The display device 1 may include a plurality of light-emitting modules 10, a display substrate 20, a frame surrounding the display substrate 20, and a control unit for controlling the light-emitting module 10.

The light-emitting module 10 may emit light by receiving electricity from the outside. The light-emitting module 10 may include a plurality of light-emitting modules 10 disposed on the display substrate 20. The display substrate 20 may include the same meaning as a display panel.

Figure 2:
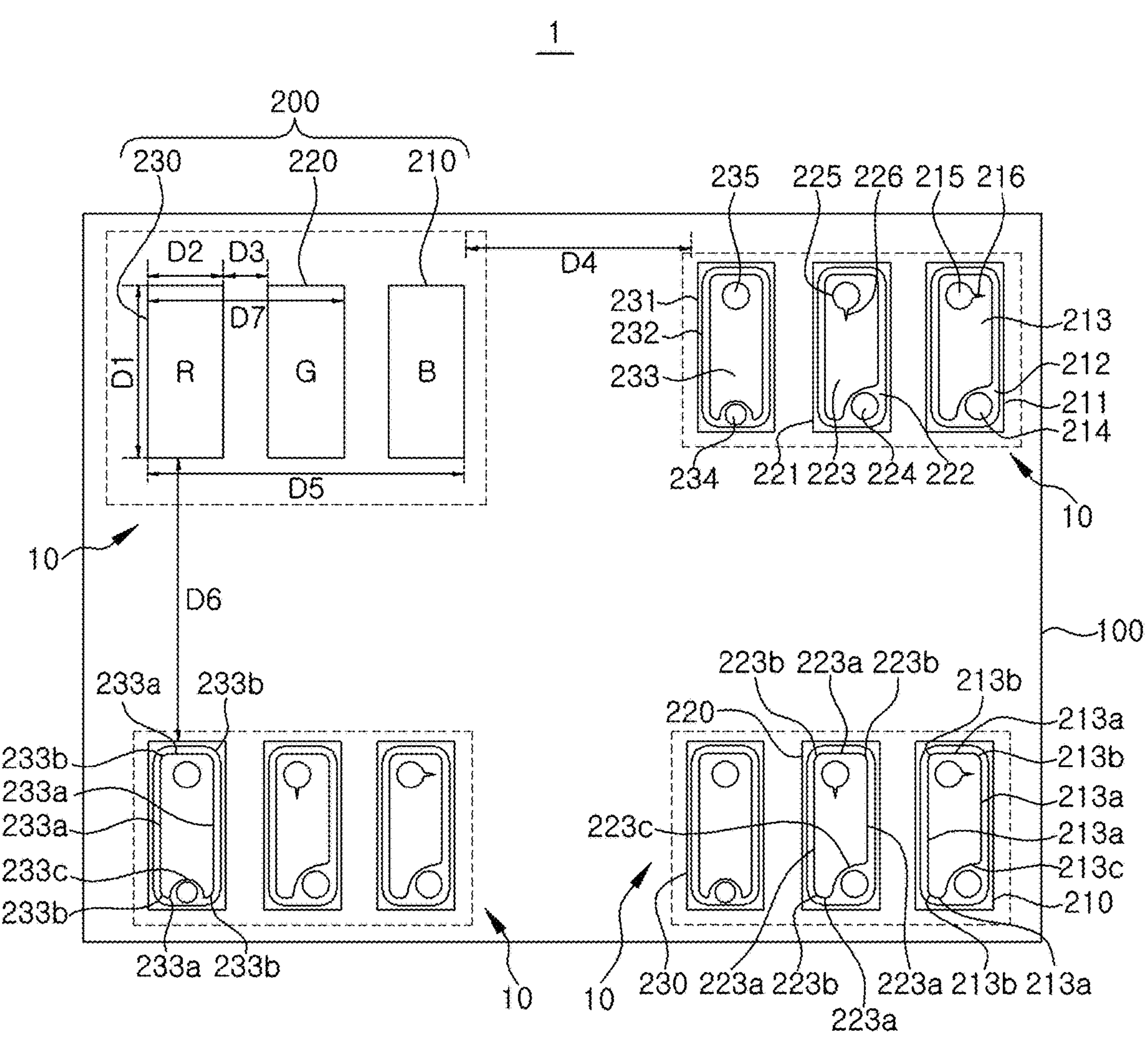
FIG. 2 is a plan view illustrating a plurality of light-emitting modules of the display device of FIG. 1.

Referring to FIG. 2, the light-emitting module 10 may include a base substrate 100, a plurality of light emitting elements 200, and a molding layer 300.

The base substrate 100 may support a plurality of light emitting elements 200 and a molding layer 300. The base substrate 100 may be a printed circuit board and may be formed of an insulating material.

The plurality of light emitting elements 200 may be supported on the base substrate 100 to emit light. The plurality of light emitting elements 200 may have a first length D1 in a first direction twice or more than a second length D2 in a second direction perpendicular to the first direction. In addition, a third length D3, which is a separation distance between the plurality of light emitting elements 200, may be smaller than the second length D2. A fourth length D4, which is a separation distance between the light emitting element of one module among a plurality of light-emitting modules 10 spaced apart from each other in the second direction and the light emitting element of another module, may be longer than the third length D3.

In case that a distance between outer sides of two outermost light emitting elements among the plurality of light emitting elements 200 is a fifth length D5 and, among the plurality of light-emitting modules 10 disposed apart from each other in the first direction, the gap between the light emitting element of one module and the light emitting element of another module is a sixth length D6, the fifth length D5 may be smaller than the sixth length D6. Further, a seventh length D7, which is a length between outer sides of two adjacent light emitting elements among the plurality of light emitting elements 200 may be larger than the second length D2. In addition, the first length D1 may have a ratio of 1:3 to 1:5 with respect to the fifth length D5.

The plurality of light emitting elements 200 are disposed above the base substrate 100 to emit light having a predetermined peak wavelength and a dominant wavelength. Each of the plurality of light emitting elements 200 emits light having the same peak wavelength, or at least one of the plurality of light emitting elements 200 emits light having a different peak wavelength, or the plurality of light emitting elements 200 may be configured to emit light of different peak wavelengths. Further, the plurality of light emitting elements 200 may emit different color temperatures or have different color coordinates. The plurality of light emitting elements 200 may include a first light emitting element 210, a second light emitting element 220, and a third light emitting element 230.

The first light emitting element 210, the second light emitting element 220, and the third light emitting element 230 emit light of the same color, or at least one of the first light emitting element 210, the second light emitting element 220, and the third light emitting element 230 may be configured to emit light of a different color. For example, the first light emitting element 210 may emit blue light, the second light emitting element 220 may emit green light, and the third light emitting element 230 may emit red light. The third light emitting element 230 emitting red light may have a higher height than the second light emitting element 220 and the first light emitting element 210. The height deviation of the third light emitting element 230 emitting red light with respect to the other light emitting elements 210 and 220 may be 40% or less. In addition, when the first light emitting element 210, the second light emitting element 220, and the third light emitting element 230 are turned on at the same time, white light can be implemented.

Further, a difference in area between at least some light emitting regions of the first light emitting element 210, the second light emitting element 220, and the third light emitting element 230 may be 10% or less. In other words, the area of the light emitting region of the first light emitting element 210 may have a difference of 10% or less with respect to a light emitting region 220*a* of the second light emitting element 220. In addition, the ratio of the area of the light emitting region of the first light emitting element 210 to the area of the light emitting region of the second light emitting element 220 may be 1:0.9 to 1:1.1. In case that the same current is supplied to the first light emitting element 210 and the second light emitting element 220, when the current flows to the N-type electrode and the P-type electrode to be described later, the current density difference can be minimized, so that a specific light emitting element can be prevented from being damaged by the application of an excessive current density. When the difference in area between the plurality of light emitting elements 200 is large, it is difficult to control the luminous intensity ratio, which makes it difficult to perform accurate color control. However, when the difference in area is within 10%, the accurate color control can be performed.

In addition, the light emitting region of the first light emitting element 210 may have a shape similar to or identical to that of the light emitting region of the second light emitting element 220 when viewed from the up-down direction. When the peak wavelengths or the color coordinates of the lights emitted from the first light emitting element 210 and the second light emitting element 220 are different, the difference may increase due to a difference in shape between the light emitting regions. In other words, when the deviation of the shape of the light emitting regions is minimized, it is possible to improve the visual uniformity, so that by forming the shape of the light emitting region of the first light emitting element 210 and the shape of the light emitting region of the second light emitting element 220 to be similar, the difference in visibility between the respective light emitting elements can be improved to be minimized. In addition, the shape of the light emitting region of the first light emitting element 210 may be formed differently from the shape of the light emitting region of the third light emitting element 230.

Further, energy band gaps of the first light emitting element 210 and the second light emitting element 220 may be formed differently. For example, the energy band gap of the second light emitting element 220 may be smaller than the energy band gap of the first light emitting element 210. By forming the energy band gaps of the first light emitting element 210 and the second light emitting element 220 differently, it is possible to implement the light emitting elements having the same shape but emitting different peak wavelengths.

The light from the first light emitting element 210 may generate a first peak wavelength and a first dominant wavelength. The first light emitting element 210 may have the first peak wavelength in the range of 430 nm to 480 nm, and may have an energy band gap in the range of 2.5 eV to 2.85 eV. In addition, the difference between the first peak wavelength and the first dominant wavelength may be 1 to 10 nm. For example, the first peak wavelength of the first light emitting element 210 may be 460 nm and the first dominant wavelength may be 470 nm. Since the second peak wavelengths of the first light emitting element 210 and the second light emitting element 220, which will be described later, may have a peak wavelength gap of 50 nm to 100 nm, a unique color can be emitted while the luminous efficiency is maximized. The difference between the first peak wavelength and the first dominant wavelength may form a first absolute value. The first absolute value is a value within the range of 1 to 10 nm. The first peak wavelength and the first dominant wavelength may be measured for light generated from the first light emitting element 210 and transmitted through the molding layer 300 or may be measured after the molding layer 300 is removed. In addition to the first peak wavelength and the first dominant wavelength, second and third peak wavelengths and second and third dominant wavelengths to be described later may be obtained through optical measuring equipment or a spectrometer or spectroradiometer. The optical measuring equipment may be, for example, CAS of Instruments systems.

The first light emitting element 210 may include a first element substrate 211, a first N-type semiconductor layer 212, a first P-type semiconductor layer 213, a first active layer (not shown), a first N-type electrode 214, a first P-type electrode 215, a first extension part 216, and a first insulating layer (not shown).

The first element substrate 211 may be an insulating or conductive substrate. The first element substrate 211 may be a growth substrate for growing the first N-type semiconductor layer 212 and the first P-type semiconductor layer 213, and for example, may include one or more of gallium nitride, GaAs, Si, sapphire, patterned sapphire, PET, glass substrate, and quartz. The first element substrate 211 may be disposed above the first N-type semiconductor layer 212. The light generated in the first active layer may be transmitted through the first element substrate 211 to be emitted to the outside. The first element substrate 211 may correspond to a transmission path through which light passes, and may serve as a lens that disperses light or diffuses light therein. When viewed from the top, the first element substrate 211, and the second element substrate 221 and the third element substrate 231, which will be described later, may have substantially similar sizes or the same area. In other words, a difference in area between the element substrates 211, 221, and 231 may be within 10%. In addition, when the first light emitting element 210 is viewed from the up-down direction, the edge of the first element substrate 211 may be spaced apart from the edge of the first N-type semiconductor layer 212 to surround the edge of the first N-type semiconductor layer 212.

The first N-type semiconductor layer 212 may be disposed above the first P-type semiconductor layer 213. The first N-type semiconductor layer 212 may include N-type impurities (e.g., Si, Ge, or Sn). For example, the first N-type semiconductor layer 212 may include GaN or AlGaN including Si as a dopant. Although the first N-type semiconductor layer 212 is illustrated as a single layer in the drawings, this is merely an example, and the first N-type semiconductor layer 212 may be formed of multiple layers or may include a superlattice layer. The first N-type semiconductor layer 212 may have a larger area than the first P-type semiconductor layer 213.

The first P-type semiconductor layer 213 may be disposed between the first N-type semiconductor layer 212 and the base substrate 100. In other words, the first P-type semiconductor layer 213 and the first N-type semiconductor layer 212 may be sequentially stacked from the base substrate 100 side. Further, the first P-type semiconductor layer 213 may be a light emitting region of the first light emitting element 210. The first P-type semiconductor layer 213 may include P-type impurities (e.g., Mg, Sr, or Ba). For example, the first P-type semiconductor layer 213 may include GaN or AlGaN including Mg as a dopant. Although the first P-type semiconductor layer 213 is shown as a single layer in the drawings, this is merely an example, and the first P-type semiconductor layer 213 may be formed of multiple layers or may include a superlattice layer. The difference in area between the first N-type semiconductor layer 212 and the first P-type semiconductor layer 213 may be greater than the difference in area between the third N-type semiconductor layer 232 and the third P-type semiconductor layer 233.

In addition, when the first light emitting element 210 is viewed in the up-down direction, the edge of the first P-type semiconductor layer 213 may include four first linear portions 213*a*, and three or more first round portions 213*b* arranged between the four first linear portions 213*a* and having a convexly curved shape. The four first linear portions 213*a* and the first round portions 213*b* may be alternately arranged along the edge of the first N-type semiconductor layer 212. In addition, the edge of the first P-type semiconductor layer 213 may include a first corner recess portion 213*c* disposed between any two first linear portions 213*a* among the four first linear portions 213*a* and having a concavely curved shape.

The first N-type semiconductor layer 212, the first P-type semiconductor layer 213, and the first active layer may include a III-V series nitride-based semiconductor, for example, a nitride-based semiconductor such as Al, Ga, or In.

The first active layer may include a multi-quantum well (MQW) structure, and the composition ratio of the nitride-based semiconductor may be adjusted to emit a desired wavelength. For example, the first active layer may emit blue light or ultraviolet light depending on the semiconductor material forming the layer and its composition ratio. The first active layer may be positioned between the first N-type semiconductor layer 212 and the first P-type semiconductor layer 213. Some of the active layers of the plurality of light emitting elements 200 may have different thicknesses. In other words, the first active layer of the first light emitting element 210, a second active layer of the second light emitting element 220, and a third active layer of the third light emitting element 230 may be formed to have different the thicknesses from each other. When the active layers of the plurality of light emitting elements 200 are formed to have the same thickness, light generated from one light emitting element may affect the active layer of another adjacent light emitting element to cause non-emission. When the active layers of the plurality of light emitting elements 200 are formed to have different thicknesses, since the active layers may be formed with different heights, the effect of light generated from one light emitting element on the active layer of another adjacent light emitting element can be reduced, which increases the luminous efficiency. As another way, the heights of the plurality of active layers may be adjusted by forming heights of the N-type semiconductor layer or the P-type semiconductor layer between the plurality of light emitting elements 200 differently.

The first N-type electrode 214 may be disposed between the first N-type semiconductor layer 212 and the base substrate 100 and electrically connected to the first N-type semiconductor layer 212. The first N-type electrode 214 may be disposed on a portion of the first N-type semiconductor layer 212 exposed through the first recess portion 213*c*.

The first P-type electrode 215 may be disposed between the first P-type semiconductor layer 213 and the base substrate 100 and electrically connected to the first P-type semiconductor layer 213.

The first extension part 216 may be formed to extend from the first P-type electrode 215. In other words, the first extension part 216 may extend from the first P-type electrode 215 in the second direction. Further, the first extension part 216 may horizontally extend in one direction from any one of the first N-type electrode 214 and the first P-type electrode 215.

The first insulating layer may cover the first N-type semiconductor layer 212 and the first P-type semiconductor layer 213. The first insulating layer may be formed of a material such as SiOx, SiNx, Si, or epoxy. The insulating layers included in some of the plurality of light emitting elements 200 may be of the same material, but the present disclosure is not limited thereto. In other words, the first insulating layer of the first light emitting element 210, a second insulating layer of the second light emitting element 220, and a third insulating layer of the third light emitting element 230 may all be formed of the same material. When the insulating layers included in some of the plurality of light emitting elements 200 are formed of the same material, the impact deviation between the light emitting elements can be reduced by equalizing the influence of heat and shock generated outside and inside the light emitting elements. The first insulating layer of the first light emitting element 210 and the second insulating layer of the second light emitting element 220 may be made of the same material. For example, the first insulating layer of the first light emitting element 210 and the second insulating layer of the second light emitting element 220 may include a $SiO_2$ material. The first insulating layer of the first light emitting element 210 may include a material different from that of the third insulating layer of the third light emitting element 230. For example, the third insulating layer of the third light emitting element 230 may include SiNx.

The second light emitting element 220 may be disposed between the first light emitting element 210 and the third light emitting element 230. The light from the second light emitting element 220 may generate a second peak wavelength and a second dominant wavelength. The second light emitting element 220 may have a second peak wavelength in the range of 490 nm to 550 nm, and may have an energy band gap in the range of 2.2 eV to 2.6 eV. In addition, the range of the difference between the second peak wavelength and the second dominant wavelength may be 5 to 15 nm. For example, the second peak wavelength may be 523 nm, and the second dominant wavelength may be 530 nm. The second peak wavelength may be greater than the first peak wavelength, and the second dominant wavelength may be greater than the first dominant wavelength. A first absolute value, which is an absolute value of the difference between the first peak wavelength and the first dominant wavelength, may be smaller than a second absolute value, which is an absolute value of the difference between the second peak wavelength and the second dominant wavelength. The second absolute value is a value in the range of 5 to 15 nm. A first dominant difference value, which is an absolute value of the difference between the second dominant wavelength and the first dominant wavelength, may be greater than a first peak difference value, which is an absolute value of the difference between the second peak wavelength and the first peak wavelength. The second peak wavelength and the second dominant wavelength may be measured for light generated from the second light emitting element 220 and transmitted through the molding layer 300 or may be measured after the molding layer 300 is removed.

The second light emitting element 220 may include a second element substrate 221, a second N-type semiconductor layer 222, a second P-type semiconductor layer 223, a second active layer (not shown), a second N-type electrode 224, a second P-type electrode 225, a second extension part 226, and a second insulating layer (not shown).

The second element substrate 221 may be an insulating or conductive substrate. The second element substrate 221 may be a growth substrate for growing the second N-type semiconductor layer 222 and the second P-type semiconductor layer 223, and for example, may include one or more of gallium nitride, GaAs, Si, sapphire, patterned sapphire, PET, glass substrate, and quartz. The second element substrate 221 may be disposed above the second N-type semiconductor layer 222. The light generated in the second active layer may be transmitted through the second element substrate 221 to be emitted to the outside. In addition, when the second light emitting element 220 is viewed in the up-down direction, the edge of the second element substrate 221 is spaced apart from the edge of the second N-type semiconductor layer 222, to surround the edge of the second N-type semiconductor layer 222. Further, when the second light emitting element 220 is viewed in the up-down direction, the smaller one of the first element substrate 211 and the second element substrate 221 may have a size that is 90% or more of the larger one of the first element substrate 211 and the second element substrate 221.

The second N-type semiconductor layer 222 may be disposed between the second P-type semiconductor layer 223 and the second element substrate 221. The second N-type semiconductor layer 222 may include N-type impurities (e.g., Si, Ge, or Sn). For example, the second N-type semiconductor layer 222 may include GaN or AlGaN including Si as a dopant. Although the second N-type semiconductor layer 222 is illustrated as a single layer in the drawings, this is merely an example, and the second N-type semiconductor layer 222 may be formed of multiple layers or may include a superlattice layer. The second N-type semiconductor layer 222 may have a larger area than the second P-type semiconductor layer 223. The area of the first N-type semiconductor layer 212 may be larger than that of the second N-type semiconductor layer 222.

The second P-type semiconductor layer 223 may be disposed between the second N-type semiconductor layer 222 and the base substrate 100. In other words, the second P-type semiconductor layer 223 and the second N-type semiconductor layer 222 may be sequentially stacked from the base substrate 100. Further, the second P-type semiconductor layer 223 may be a light emitting region of the second light emitting element 220. The second P-type semiconductor layer 223 may include P-type impurities (e.g., Mg, Sr, or Ba). For example, the second P-type semiconductor layer 223 may include GaN or AlGaN including Mg as a dopant. Although the second P-type semiconductor layer 223 is shown as a single layer in the drawings, this is merely an example, and the second P-type semiconductor layer 223 may be formed of multiple layers or may include a superlattice layer. In addition, the second P-type semiconductor layer 223 may be formed in a similar or identical shape to the first P-type semiconductor layer 213.

In addition, the edge of the second P-type semiconductor layer 223 has four second linear portions **223*a*, and three or more second round portions 223*b* arranged between the four second linear portions 223*a* and having a convexly curved shape. The four second linear portions 223*a* and the second round portions 223*b* may be alternately arranged along the edge of the second N-type semiconductor layer 222. In addition, the edge of the second P-type semiconductor layer 223 may include a second corner recess portion 223*c* disposed between any two second linear portions 223*a* among the four second linear portions 223*a*** and having a concavely curved shape.

The second N-type semiconductor layer 222, the second P-type semiconductor layer 223, and the second active layer may include a III-V series nitride-based semiconductor, for example, a nitride-based semiconductor such as Al, Ga, or In.

The second active layer may include a multi-quantum well (MQW) structure, and the composition ratio of the nitride-based semiconductor may be adjusted to emit a desired wavelength. For example, the second active layer may emit green light or ultraviolet light depending on the semiconductor material forming the layer and its composition ratio. The second active layer may be positioned between the second N-type semiconductor layer 222 and the second P-type semiconductor layer 223.

The second N-type electrode 224 may be disposed between the second N-type semiconductor layer 222 and the base substrate 100 and electrically connected to the second N-type semiconductor layer 222. The second N-type electrode 224 may be disposed on a portion of the first N-type semiconductor layer 212 exposed by the second corner recess portion **224*b***.

The second P-type electrode 225 may be disposed between the second P-type semiconductor layer 223 and the base substrate 100 and electrically connected to the second P-type semiconductor layer 223.

The second extension part 226 may be formed to extend from the second P-type electrode 225. Further, the second extension part 226 may extend in a direction different from that of the first extension part 216. In other words, the second extension part 226 may extend from the second P-type electrode 225 in the first direction. In addition, the second extension part 226 may horizontally extend in another direction different from one direction from any one of the second N-type electrode 224 and the second P-type electrode 225.

The second insulating layer may cover the second N-type semiconductor layer 222 and the second P-type semiconductor layer 223. The second insulating layer may be formed of a material such as SiOx, SiNx, Si, or epoxy.

A light of the third light emitting element 230 may generate a third peak wavelength and a third dominant wavelength. The third light emitting element 230 may have a third peak wavelength in the range of 580 nm to 730 nm, and may have an energy band gap in the range of 1.7 eV to 2.1 eV. In addition, the range of the difference between the third peak wavelength and the third dominant wavelength may be 5 to 30 nm. For example, the third peak wavelength may be 630 nm, and the third dominant wavelength may be 620 nm. The third peak wavelength may be greater than the second peak wavelength, and the third dominant wavelength may be greater than the second dominant wavelength. A third absolute value, which is the absolute value of the difference between the third peak wavelength and the third dominant wavelength, may be greater than the second absolute value, which is the absolute value of the difference between the second peak wavelength and the second dominant wavelength. The third absolute value is a value in the range of 5 to 30 nm.

The first peak difference value, which is the absolute value of the difference between the second peak wavelength and the first peak wavelength, is smaller than a second peak difference value, which is an absolute value of the difference between the third peak wavelength and the second peak wavelength, and the second peak wavelength may be greater than the first peak wavelength, and the third peak wavelength may be greater than the second peak wavelength. Further, a second dominant difference value, which is an absolute value of the difference between the third dominant wavelength and the second dominant wavelength, may be smaller than the second peak difference value, which is an absolute value of the difference between the third peak wavelength and the second peak wavelength. In addition, the third absolute value, which is an absolute value of the difference between the third peak wavelength and the third dominant wavelength, may be greater than the first absolute value, which is an absolute value of the difference between the first peak wavelength and the first dominant wavelength.

A third dominant difference value, which is an absolute value of the difference between the third dominant wavelength and the first dominant wavelength, may be smaller than a third peak difference value, which is an absolute value of the difference between the third peak wavelength and the first peak wavelength. The first dominant difference value, which is the absolute value of the difference between the second dominant wavelength and the first dominant wavelength, may be smaller than the second dominant difference value, which is the absolute value of the difference between the third dominant wavelength and the second dominant wavelength. The second dominant wavelength may be greater than the first dominant wavelength, and the third dominant wavelength may be greater than the second dominant wavelength. The third peak wavelength and the third dominant wavelength may be measured for light generated from the third light emitting element 230 and transmitted through the molding layer 300 or may be measured after the molding layer 300 is removed.

The third light emitting element 230 includes a third element substrate 231, a third N-type semiconductor layer 232, a third P-type semiconductor layer 233, a third active layer (not shown), a third N-type electrode 234, a third P-type electrode 235, and a third insulating layer (not shown).

The third element substrate 231 may be an insulating or conductive substrate. The third element substrate 231 may be a growth substrate for growing the third N-type semiconductor layer 232 and the third P-type semiconductor layer 233, and for example, may include one or more of gallium nitride, GaAs, Si, sapphire, patterned sapphire, PET, glass substrate, and quartz. The third element substrate 231 may be disposed above the third N-type semiconductor layer 232. The light generated in the third active layer may be transmitted through the third element substrate 231 and emitted to the outside. The third element substrate 231 may correspond to a transmission path through which light passes, and may serve as a lens that disperses light or diffuses light therein. When viewed from above, the third element substrate 231 may be formed such that an edge thereof is disposed outside the edge of the third N-type semiconductor layer 232.

The third N-type semiconductor layer 232 may be disposed on the third element substrate 231. The third N-type semiconductor layer 232 may include N-type impurities (e.g., Si, Ge, or Sn). For example, the third N-type semiconductor layer 232 may include GaN or AlGaN including Si as a dopant. Although the third N-type semiconductor layer 232 is shown as a single layer in the drawings, this is merely an example, and the third N-type semiconductor layer 232 may be formed of multiple layers or may include a superlattice layer.

The third P-type semiconductor layer 233 may be disposed between the third N-type semiconductor layer 232 and the base substrate 100. In other words, the third P-type semiconductor layer 233 and the third N-type semiconductor layer 232 may be sequentially stacked from the base substrate 100 side. Further, the third P-type semiconductor layer 233 may be a light emitting region of the third light emitting element 230. The third P-type semiconductor layer 233 may include P-type impurities (e.g., Mg, Sr, or Ba). For example, the third P-type semiconductor layer 233 may include GaN or AlGaN including Mg as a dopant. Although the third P-type semiconductor layer 233 is shown as a single layer in the drawings, this is merely an example, and the third P-type semiconductor layer 233 may be formed of multiple layers or may include a superlattice layer. In addition, an area of the third P-type semiconductor layer 233 may be larger than those of the first P-type semiconductor layer 213 and the second P-type semiconductor layer 223.

In addition, when the third light emitting element 230 is viewed from the up-down direction, the edge of the third P-type semiconductor layer 233 may include four third straight lines 233*a*, and four or more third round parts 233*b* arranged between the four third straight lines 233*a* and having a convexly curved shape. The four third linear portions 233*a* and the third round portions 233*b* may be alternately arranged along the edge of the third N-type semiconductor layer 232. In addition, the edge of the third P-type semiconductor layer 233 may include a groove portion 233*c* which is formed on any one of the third linear portion 233*a* among the four third linear portions 233*a* and has a concave shape depressed toward the center of the third P-type semiconductor layer 233.

The third N-type semiconductor layer 232, the third P-type semiconductor layer 233, and the third active layer may include a III-V series phosphide-based semiconductor.

The third active layer may include a multi-quantum well (MQW) structure, and the composition ratio of the phosphide-based semiconductor may be adjusted to emit a desired wavelength. For example, the third active layer may emit red light or ultraviolet light depending on the semiconductor material forming the layer and its composition ratio. The third active layer may be positioned between the third N-type semiconductor layer 232 and the third P-type semiconductor layer 233.

The third N-type electrode 234 may be electrically connected to the third N-type semiconductor layer 232. The third N-type electrode 234 may be disposed on a portion of the first N-type semiconductor layer 212 exposed through the groove portion 233*c*.

The third P-type electrode 235 may be electrically connected to the third P-type semiconductor layer 233.

The third insulating layer may cover the third N-type semiconductor layer 232 and the third P-type semiconductor layer 233. The third insulating layer may be formed of a material such as SiOx, SiNx, Si, or epoxy. For example, the third insulating layer of the third light emitting element 230 may include SiNx.

The molding layer 300 may cover the plurality of light emitting elements 200 and improve light extraction efficiency of the plurality of light emitting elements 200. Further, the molding layer 300 may encapsulate the plurality of light emitting elements 200 and may refract light emitted from the plurality of light emitting elements 200. In addition, the molding layer 300 may be a light-transmitting transparent molding for transmitting light emitted from the plurality of light emitting elements 200, and may be formed of a resin containing at least one of silicone series, epoxy series, PMMA (polymethyl methacrylate) series, polyethylene (PE) series, and polystyrene (PS) series. Furthermore, the molding layer 300 may be formed of a fluorine resin to improve light efficiency emitted from the plurality of light emitting elements 200.

Meanwhile, the molding layer 300 may include a light diffusion material capable of diffusing light emitted from the plurality of light emitting elements 200. For example, the light diffusion material may include one or more of $TiO_2$, BaO, $SiO_2$, MgO, and $Y_2O_3$ capable of scattering light, and may be distributed inside the molding layer 300. In addition, the molding layer 300 may include a wavelength conversion material capable of converting a wavelength of light emitted from the plurality of light emitting elements 200. For example, the wavelength conversion material may include a fluorescent material capable of emitting at least one of red light, blue light, and green light, and may be distributed inside the molding layer 300.

An electric circuit may be arranged on the display substrate 20. For example, the display substrate 20 may be a PCB substrate on which the electric circuit is printed.

Figure 3:
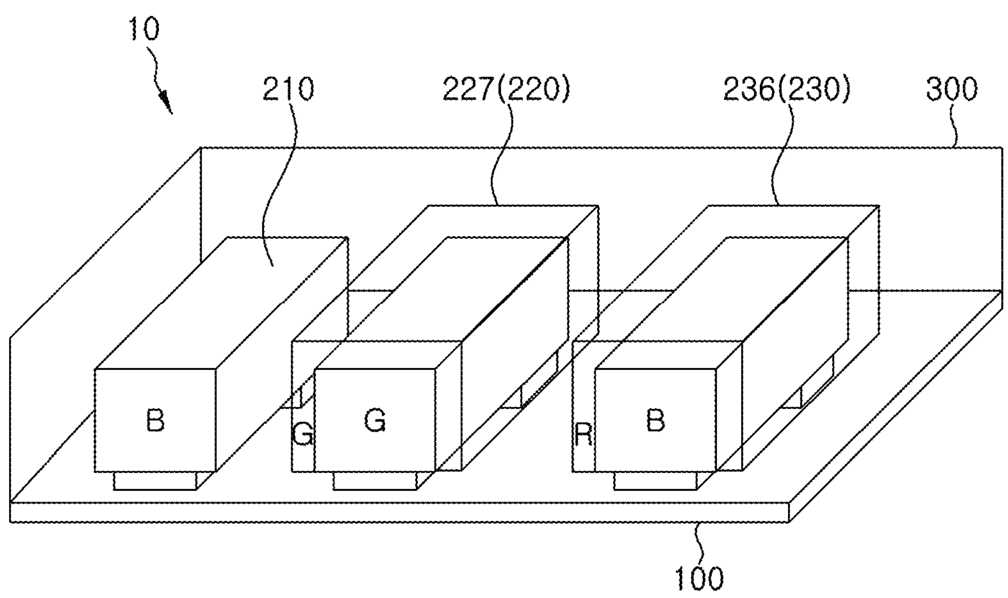
FIG. 3 is a perspective view showing a light-emitting module of a display device according to a second embodiment of the present disclosure.

Hereinafter, a light-emitting module 10 according to a second embodiment of the present disclosure and a display device 1 including the same will be described with reference to FIG. 3. In describing the second embodiment of the present disclosure, the differences from the above-described embodiment are mainly described, and the same description and reference numerals refer to the above-described embodiment.

In the light-emitting module 10 according to the second embodiment of the present disclosure and the display device 1 including the same, the first active layer of the first light emitting element 210, the second active layer of the second light emitting element 220, and the third active layer of the three light emitting element 230 may emit the same wavelength of light. In addition, the second light emitting element 220 may further include a first wavelength conversion layer 227, and the third light emitting element 230 may further include a second wavelength conversion layer 236.

A deviation of a peak wavelength of light generated from each of the first active layer, the second active layer, and the third active layer may be 10 nm or less. When the same peak wavelength of light is formed in the first active layer, the second active layer, and the third active layer, the light emitting area and shape of each semiconductor layer can be equally applied, so that internal factors and internal variations other than the peak wavelength of light emitted from the plurality of light emitting elements 200 can be minimized.

The first wavelength conversion layer 227 includes a fluorescent material, and the fluorescent material may convert a wavelength of light generated from a light emitting region of the second light emitting element 220. The wavelength of the light emitting region of the second light emitting element 220 may be the same as the wavelength of the light emitting region of the first light emitting element 210 and the wavelength of the light emitting region of the third light emitting element 230. For example, the light emitting region of the second light emitting element 220, the light emitting region of the first light emitting element 210, and the light emitting region of the third light emitting element 230 may emit blue light. In addition, the first wavelength conversion layer 227 may convert blue light emitted from the light emitting region of the second light emitting element 220 into green light.

The second wavelength conversion layer 236 includes a fluorescent material, and the fluorescent material may convert a wavelength of light generated from a light emitting region of the third light emitting element 230. For example, the first wavelength conversion layer 227 may convert blue light emitted from the light emitting region of the third light emitting element 230 into red light.

Figure 4:
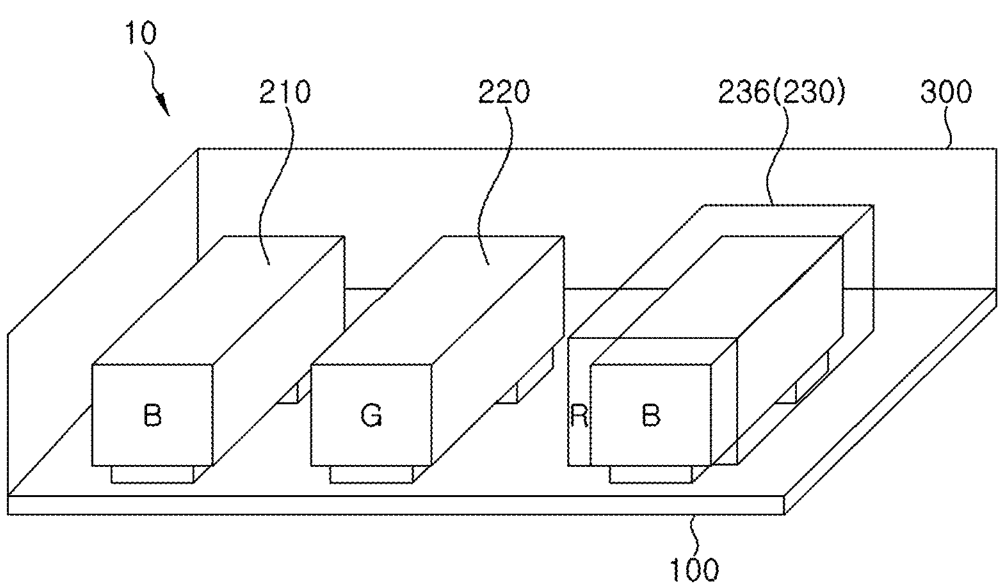
FIG. 4 is a perspective view showing a light-emitting module of a display device according to a third embodiment of the present disclosure.

Hereinafter, referring to FIG. 4, a light-emitting module 10 according to a third embodiment of the present disclosure and a display device 1 including the light-emitting module 10 will be described. In describing the third embodiment of the present disclosure, the differences from the above-described embodiments are mainly described, and the same description and reference numerals refer to the above-described embodiments.

In the light-emitting module 10 according to the third embodiment of the present disclosure and the display device 1 including the same, the first active layer of the first light emitting element 210 and the third active layer of the third light emitting element 230 may emit the same wavelength of light. In addition, the third light emitting element 230 may further include the second wavelength conversion layer 236.

A deviation of a peak wavelength of light generated from each of the first active layer and the third active layer may be 10 nm or less. When the same peak wavelength of light is formed in the first active layer and the third active layer, the light emitting area and shape of each semiconductor layer can be equally applied, so that internal factors and internal deviations other than the peak wavelength of light emitted from some of the plurality of light emitting elements 200 can be minimized. In addition, a deviation between the peak wavelength of light generated in the first active layer and the third active layer and the peak wavelength of light generated in the second active layer may be formed to a maximum of 120 nm or less. The band gap energy deviation of the first active layer, the second active layer, and the third active layer may not exceed 0.6 eV.

The second wavelength conversion layer 236 includes a fluorescent material, and the fluorescent material may convert a wavelength of light generated from a light emitting region of the third light emitting element 230. For example, the second wavelength conversion layer 236 may convert blue light emitted from the light emitting region of the third light emitting element 230 into red light.

Figure 5:
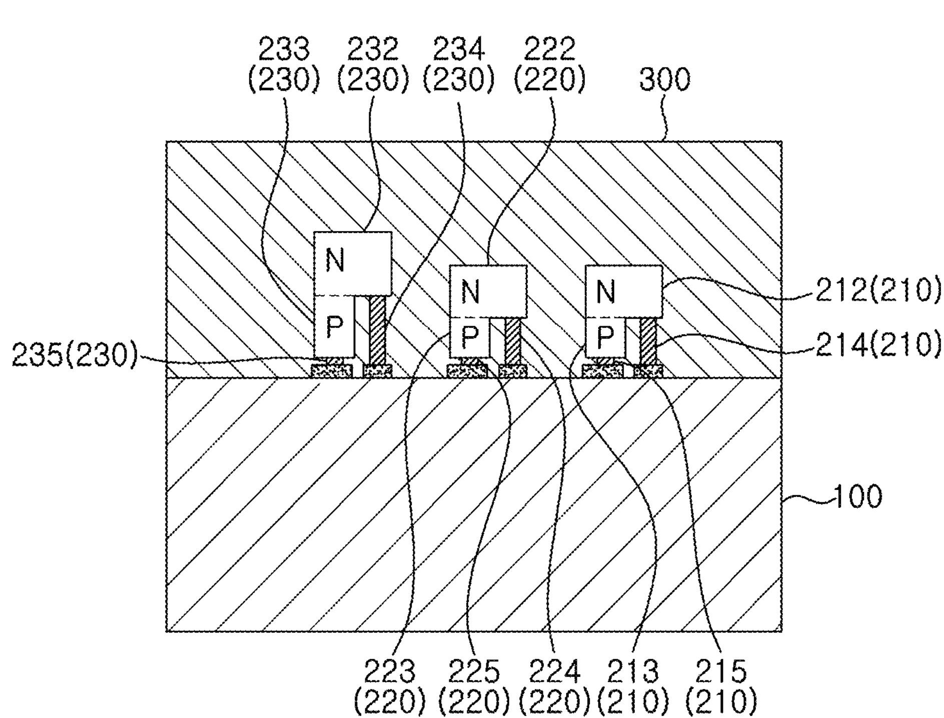
FIG. 5 is a view showing the arrangement of an N-type semiconductor layer and a P-type semiconductor layer of a light-emitting module of a display device according to a fourth embodiment of the present disclosure.

Hereinafter, a light-emitting module 10 according to a fourth embodiment of the present disclosure and a display device 1 including the same will be described with reference to FIG. 5. In describing the fourth embodiment of the present disclosure, the differences from the above-described embodiments are mainly described, and the same description and reference numerals refer to the above-described embodiments.

In the light-emitting module 10 according to the fourth embodiment of the present disclosure and the display device 1 including the same, the arrangement of the P-type semiconductor layer and the N-type semiconductor layer of each of the plurality of light emitting elements 220 may be different from that in the above-described first embodiment.

In the plurality of light emitting elements 210, 220, and 230, N-type semiconductor layers 212, 222, and 223 may be disposed above the P-type semiconductor layers 213, 223, and 233. Further, the plurality of light emitting elements 210, 220, and 230 may be flip chips. In the case where the plurality of light emitting elements 210, 220, and 230 are flip chips, the P-type semiconductor layers 213, 223, and 233 and the N-type semiconductor layers 212, 222, and 223 of the plurality of light emitting elements 210, 220, and 230 may be directly connected to the base substrate 100 by silver paste. In addition, the plurality of light emitting elements 210, 220, and 230 may be lateral chips. In the case where the plurality of light emitting elements 210, 220, and 230 are lateral chips, the P-type semiconductor layers 213, 223, and 233 and the N-type semiconductor layers 212, 222, and 223 of the plurality of light emitting elements 210, 220, and 230 may be connected to a wire W to be described later. In the case where the plurality of light emitting elements 210, 220, and 230 are lateral chips, the plurality of light emitting elements 210, 220, and 230 may be connected to the base substrate 100 by silicon.

Hereinafter, the light-emitting modules 10 according to the fifth to seventh embodiments of the present disclosure and the display devices 1 including the same will be described. In the light-emitting modules 10 according to the fifth to seventh embodiments of the present disclosure and the display devices 1 including the same, the arrangement of the P-type semiconductor layers 213, 223, and 233 and the N-type semiconductor layers 212, 222, and 233 of each of the plurality of light-emitting elements 220 may be different from that in the first embodiment described above.

Figure 6:
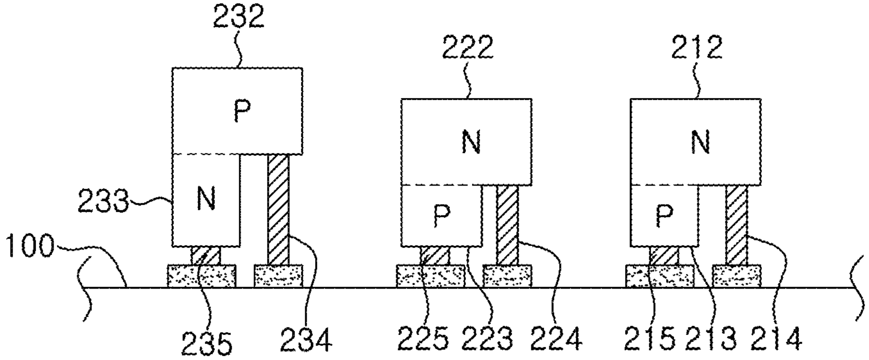
FIG. 6 is a view showing the arrangement of an N-type semiconductor layer and a P-type semiconductor layer of a light-emitting module of a display device according to a fifth embodiment of the present disclosure.

Hereinafter, the fifth embodiment will be described with reference to FIG. 6. In describing the fifth embodiment of the present disclosure, the differences from the above-described embodiments will be mainly described, and the same description and reference numerals refer to the above-described embodiments.

In at least one of the plurality of light emitting elements 210, 220, and 230, the arrangement of the p-type semiconductor layer and the arrangement of the n-type semiconductor layer may be different. For example, the P-type semiconductor layer 232 may be disposed above the N-type semiconductor layer 233 in at least one light emitting element 230 among the plurality of light emitting elements 210, 220, and 230. In addition, in the other light emitting elements 210 and 220, the N-type semiconductor layers 212 and 222 may be disposed above the P-type semiconductor layers 213 and 223. The light emitting element 230 in which the P-type semiconductor layer and the N-type semiconductor layer are disposed differently may be the third light emitting element 230 that emits red light.

Figure 7:
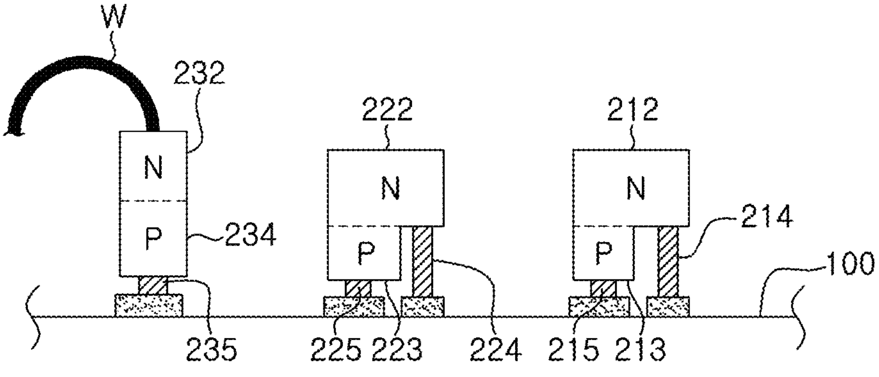
FIG. 7 is a view showing the arrangement of an N-type semiconductor layer and a P-type semiconductor layer of a light-emitting module of a display device according to a sixth embodiment of the present disclosure.

Hereinafter, the sixth embodiment will be described with reference to FIG. 7. In describing the sixth embodiment of the present disclosure, the differences the above-described embodiments will be mainly described, and the same description and reference numerals refer to the above-described embodiments.

In the plurality of light emitting elements 210, 220, and 230, the arrangement of the P-type semiconductor layer and the N-type semiconductor layer may be the same. For example, in the plurality of light emitting elements 210, 220, and 230, the N-type semiconductor layer may be disposed above the P-type semiconductor layer.

In addition, in at least one of the plurality of light emitting elements 210, 220, and 230, the connection method between the electrode and each of the P-type semiconductor layer and the N-type semiconductor layer may be different. For example, the third P-type semiconductor layer 234 of at least one third light emitting element 230 among the plurality of light emitting elements 210, 220, and 230 may be directly connected to the base substrate 100 through a conductive material or an adhesive material. In addition, the third N-type semiconductor layer of at least one third light emitting elements 230 among the plurality of light emitting elements 210, 220, and 230 may be connected to the base substrate 100 through a wire W. Further, in the other light emitting elements 210 and 220, each of the P-type semiconductor layers 213 and 223 and the N-type semiconductor layers 212 and 222 may be directly connected to the base substrate 100 through a conductive material or an adhesive material.

Among the plurality of light emitting elements 210, 220, and 230, the third light emitting element 230 may be a vertical chip. In addition, the light emitting elements 210 and 220 which are not the vertical chip may be flip chips.

Meanwhile, in addition to such configurations, according to the seventh embodiment of the present disclosure, in at least one of the plurality of light emitting elements 210, 220, and 230, the arrangement of the P-type semiconductor layer and the N-type semiconductor layer and the connection method between each of the P-type semiconductor layer and the N-type semiconductor layer and the base substrate 100 may be different.

Figure 8:
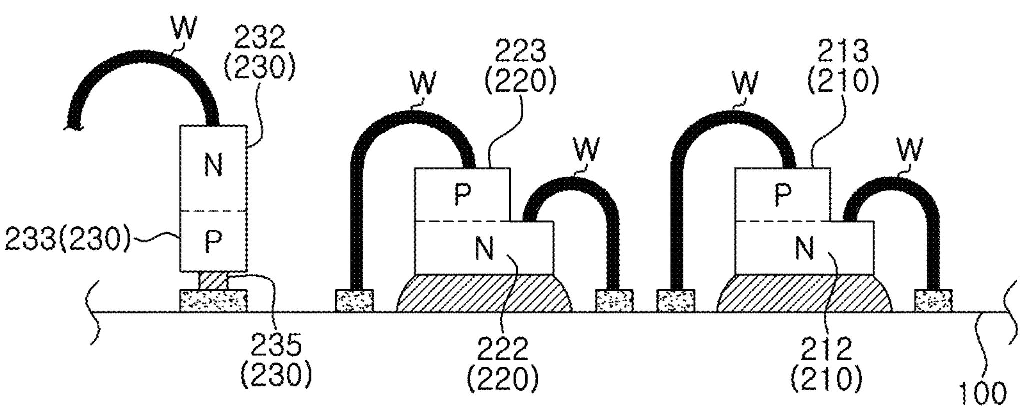
FIG. 8 is a view showing the arrangement of an N-type semiconductor layer and a P-type semiconductor layer of a light-emitting module of a display device according to a seventh embodiment of the present disclosure.

Hereinafter, the seventh embodiment will be described with reference to FIG. 8. In describing the seventh embodiment of the present disclosure, the differences from the above-described embodiments will be mainly described, and the same description and reference numerals refer to the above-described embodiments.

In at least one of the plurality of light emitting elements 210, 220, and 230, the arrangement of the P-type semiconductor and the N-type semiconductor. For example, in the third light emitting element 230 among the plurality of light emitting elements 210, 220, and 230, the third N-type semiconductor layer 232 may be disposed above the third P-type semiconductor layer 233. In addition, in the other light emitting elements 210 and 220, the P-type semiconductor layer may be disposed above the N-type semiconductor layer.

In addition, in at least one of the plurality of light emitting elements 210, 220, and 230, the connection method between each of the p-type semiconductor and the n-type semiconductor and the base substrate 100 may be different. For example, in the third light emitting element 230 among the plurality of light emitting elements 210, 220, and 230, the third P-type semiconductor layer 233 may be directly connected to the base substrate 100 through a conductive material or an adhesive material. Further, the third N-type semiconductor layer 232 may be connected to the base substrate 100 through a wire W. In addition, in the other light emitting elements 210 and 220, each of the P-type semiconductor layer and the N-type semiconductor layer may be connected to the base substrate 100 through a wire W. In this case, the N-type semiconductor layers of the other light emitting elements 210 and 220 may be connected to the base substrate 100 by silicon.

Among the plurality of light emitting elements 210, 220, and 230, the third light emitting element 230 may be a vertical chip. In addition, the light emitting elements 210 and 220 that are not the vertical chip may be lateral chips. The light emitting elements 210 and 220, which are lateral chips, may be connected to the base substrate 100 by silicon. For example, the third light emitting element 230 may be a vertical chip. Further, the first light emitting element 210 and the second light emitting element 220 may be lateral chips. The light emitting elements 210 and 220, which are lateral chips, may be connected to the base substrate 100 by silicon.

Figure 9:
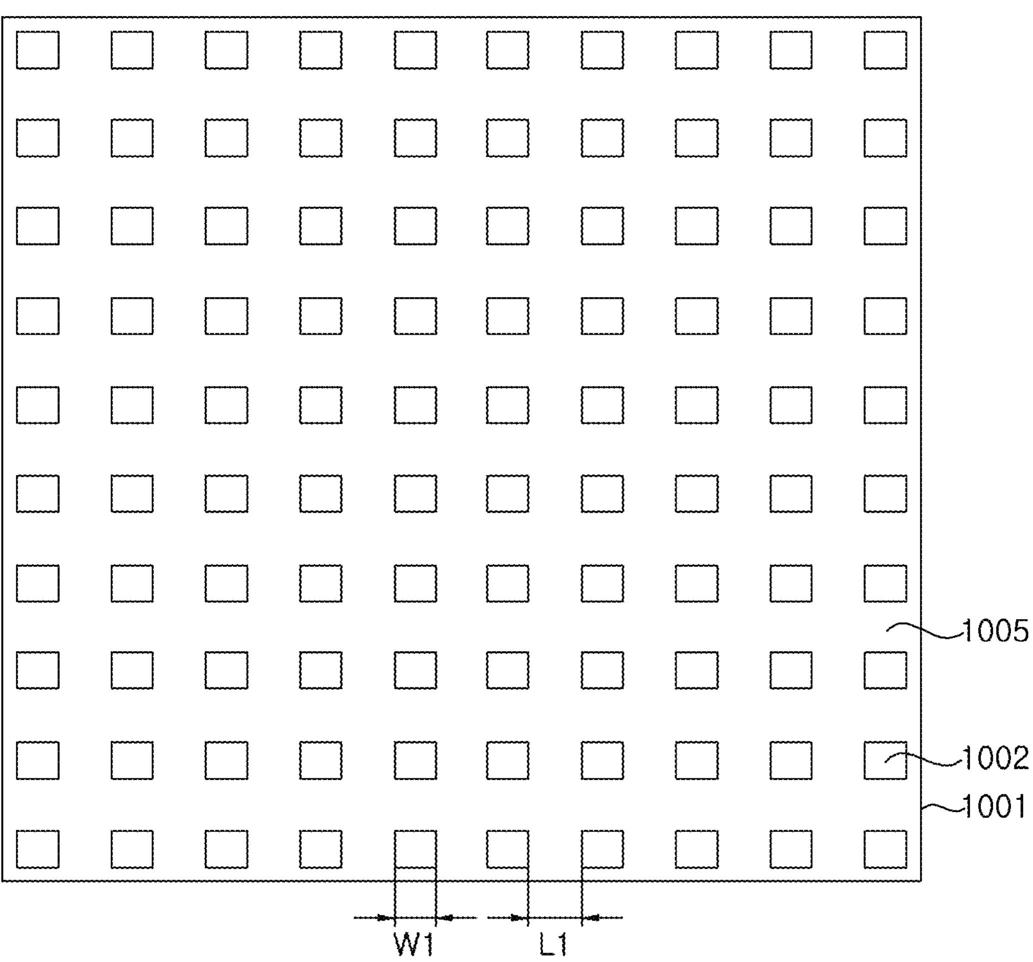
FIGS. 9 and 10 show a display device 1 according to an eighth embodiment of the present disclosure.

Hereinafter, a display device 1 according to an eighth embodiment of the present disclosure will be described with reference to FIGS. 9 and 10.

The display device 1 according to the eighth embodiment of the present disclosure may be a display panel. Further, the display device 1 may include a plurality of light emitting elements 210, 220, and 230. Such a display device 1 may be applied to a signage or a display device, a vehicle, and the like. In addition, the display device 1 includes a circuit board 1001, pixels 1002, and a buffer material layer 1005.

The circuit board 1001 or the panel board may include circuitry for passive matrix driving or active matrix driving. For example, the circuit board 1001 may include wires and resistors therein. As another example, the circuit board 1001 may include wires, transistors, and capacitors. The circuit board 1001 may also have pads (not shown) on its top surface to allow electrical connection to the circuitry disposed therein.

The plurality of pixels 1002 are arranged on the circuit board 1001. Such pixels 1002 may include the plurality of light emitting elements 210, 220, and 230 described above. Each of the plurality of light emitting elements 210, 220, and 230 may be referred to as a subpixel. The pixel 1002 may be a small light emitting element having a size of microns, a width W1 of which may have a size of 1000 μm or less. For example, when the pixels 1002 are arranged in one direction and the direction in which the pixels 1002 are arranged is referred to as an alignment direction, a distance L1 between the pixels 1002 in the alignment direction may be greater than the width W1 of the pixels 1002 in the alignment direction is the pixel in the alignment direction. As another example, in order to adjust the pixels, the distance L1 between the pixels 1002 in the alignment direction may be smaller than the width W1 of the pixels 1002 in the alignment direction.

The buffer material layer 1005 may cover the circuit board 1001 between the pixels 1002, and may cover upper surfaces of the pixels 1002. The buffer material layer 1005 may also include a matrix that is transparent to light, but the present disclosure is not limited thereto. For example, the buffer material layer 1005 may reflect or absorb light, and for this purpose, a matrix having light reflection characteristics or a matrix having light absorption characteristics may be used. Alternatively, a light absorbing material such as carbon black or a light scattering material such as silica may be contained in the matrix.

Figure 10:
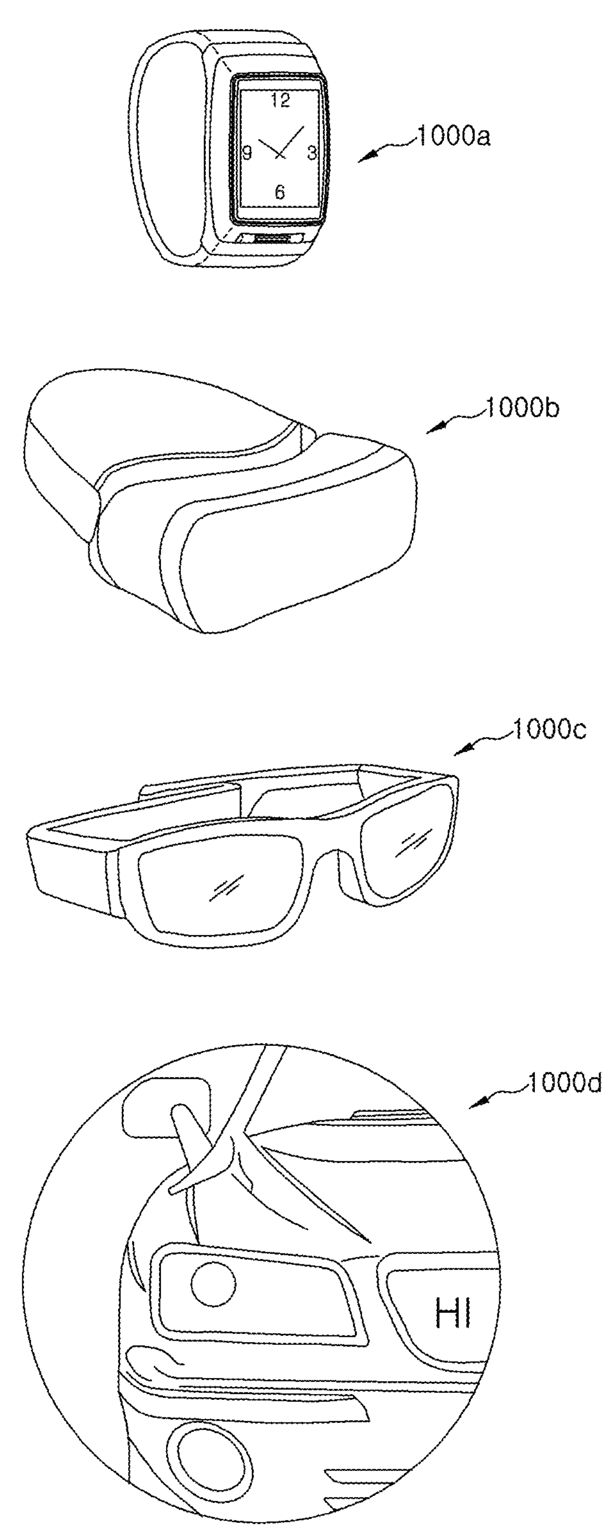

Referring to FIG. 10, the present disclosure may be employed to a smart watch 1000*a*, a VR display device such as a VR headset 1000*b*, an AR display device such as an augmented reality glasses 1000*c*, or a display device such as signage. Alternatively, the present disclosure may be applied to a display of a vehicle 1000*d* to implement a character string (English, numeric, Korean, etc.) or an icon such as a picture. The display device may be networked with an external source to implement characters or icons designated by a user. The external source may be an application or a system setting installed in a vehicle.

The examples of the present disclosure have been described above as specific embodiments, but these are only examples, and the present disclosure is not limited thereto, and should be construed as having the widest scope according to the technical spirit disclosed in the present specification. A person skilled in the art may combine/substitute the disclosed embodiments to implement a pattern of a shape that is not disclosed, but it also does not depart from the scope of the present disclosure. In addition, those skilled in the art can easily change or modify the disclosed embodiments based on the present specification, and it is clear that such changes or modifications also belong to the scope of the present disclosure.

| Explanation of reference signs | |
|---|---|
| 1: display device | |
| 10: light emitting module | 100: base substrate |
| 200: light emitting element | 210: first light emitting element |
| 211: first element substrate | 212: first N-type semiconductor layer |
| 213: first P-type semiconductor layer | 213a: first linear portion |
| 213b: first round portion | 213c: first corner recess portion |
| 214: first N-type electrode | 215: first P-type electrode |
| 216: first extension part | 220: second light emitting element |
| 221: second element substrate | 222: second N-type semiconductor layer |
| 223: second P-type semiconductor layer | 223: second linear portion |
| 223b: second round portion | 223c: second corner recess portion |
| 224: second N-type electrode | 225: second P-type electrode |
| 226: second extension part | 227: first wavelength conversion layer |
| 230: third light emitting device | 231: third element substrate |
| 232: third N-type semiconductor layer | 233: third P-type semiconductor layer |
| 233a: third linear portion | 233b: third round portion |
| 233c: groove portion | 234: third N-type electrode |
| 235: third P-type electrode | 236: second wavelength conversion layer |
| 300: molding layer | 1001: circuit board |
| 1002: pixel | 1005: buffer material layer |

What is claimed is:

1. A light-emitting module, comprising:

a base substrate; and a group of light emitters disposed on the base substrate to generate light, wherein the group of light emitters include:

a first light emitter for generating light having a first peak wavelength and a first dominant wavelength, wherein the first light emitter includes a first P-type semiconductor layer and a first N-type semiconductor layer disposed on the base substrate; and a second light emitter for generating light having a second peak wavelength and a second dominant wavelength, wherein the second light emitter includes a second P-type semiconductor layer and a second N-type semiconductor layer sequentially stacked from the base substrate, wherein, when the first light emitter is viewed from above, the first P-type semiconductor layer includes at least four linear edges, and at least three round edges having curved shapes, and the linear edges and the round edges are alternately arranged, and wherein a first absolute value, which is an absolute value of a difference between the first peak wavelength and the first dominant wavelength, is smaller than a second absolute value, which is an absolute value of a difference between the second peak wavelength and the second dominant wavelength.

2. The light-emitting module of claim 1, wherein the second peak wavelength is greater than the first peak wavelength, and the second dominant wavelength is greater than the first dominant wavelength.

3. The light-emitting module of claim 2, wherein the group of light emitters further include a third light emitter for generating light having a third peak wavelength and a third dominant wavelength, the third peak wavelength is greater than the second peak wavelength, and the third dominant wavelength is greater than the second dominant wavelength, and a third absolute value, which is an absolute value of a difference between the third peak wavelength and the third dominant wavelength, is greater than the second absolute value.

4. The light-emitting module of claim 3, wherein the first absolute value is a value in a range of 1 nm to 10 nm, the second absolute value is a value in a range of 5 nm to 15 nm, and the third absolute value is a value in a range of 5 nm to 30 nm.

5. The light-emitting module of claim 3, further comprising a molding layer covering the group of light emitters, wherein the first peak wavelength and the first dominant wavelength are measured values for light generated in the first light emitter and transmitted through the molding layer, the second peak wavelength and the second dominant wavelength are measured values for light generated in the second light emitter and transmitted through the molding layer, and the third peak wavelength and the third dominant wavelength are measured values for light generated in the third light emitter and transmitted through the molding layer.

6. The light-emitting module of claim 1, wherein the first N-type semiconductor layer has a larger area than the first P-type semiconductor layer, and the second N-type semiconductor layer has a larger area than the second P-type semiconductor layer.

7. The light-emitting module of claim 6, wherein the area of the first N-type semiconductor layer is larger than that of the second N-type semiconductor layer.

8. The light-emitting module of claim 7, wherein an area difference between the first N-type semiconductor layer and first P-type semiconductor layer is greater than an area difference between the second N-type semiconductor layer and the second P-type semiconductor layer.

9. The light-emitting module of claim 6, wherein the at least three round edges have convexly curved shapes.

10. The light-emitting module of claim 1, wherein the group of light emitters further include a third light emitter for generating light having a third peak wavelength and a third dominant wavelength, and wherein when the third light emitter is viewed from above, a third P-type semiconductor layer of the third light emitter includes at least four linear edges and at least four round edges having curved shapes, and a groove formed on any one of the linear edges and having a shape concavely depressed toward a center of the third P-type semiconductor layer.

11. The light-emitting module of claim 1, wherein the first light emitter further includes a first substrate connected to the first N-type semiconductor layer, and when the first light emitter is viewed from above, an edge of the first substrate is spaced apart from an edge of the first N-type semiconductor layer and surrounds the edge of the first N-type semiconductor layer.

12. The light-emitting module of claim 11, wherein the second light emitter further includes a second substrate connected to on the second N-type semiconductor layer, and when viewed from above, a smaller one of the first substrate or the second substrate has a size of 90% or more of a larger one of the first substrate or the second substrate.

13. The light-emitting module of claim 1, wherein the first light emitter further includes a first N-type electrode electrically connected to the first N-type semiconductor layer and a first P-type electrode electrically connected to the first P-type semiconductor layer, and one of the first N-type electrode or the first P-type electrode includes a first extension extending horizontally in one direction.

14. The light-emitting module of claim 13, wherein the second light emitter further includes a second N-type electrode electrically connected to the second N-type semiconductor layer and a second P-type electrode electrically connected to the second P-type semiconductor layer, and one of the second N-type electrode or the second P-type electrode includes a second extension extending horizontally in another direction different from the one direction.

15. A light-emitting module, comprising:

a base substrate; and a group of light emitters disposed on the base substrate to generate light, wherein the group of light emitters include:

a first light emitter for generating light having a first peak wavelength and a first dominant wavelength, wherein the first light emitter includes a first P-type semiconductor layer and a first N-type semiconductor layer disposed on the base substrate;

a second light emitter for generating light having a second peak wavelength and a second dominant wavelength, wherein the second light emitter includes a second P-type semiconductor layer and a second N-type semiconductor layer sequentially stacked from the base substrate; and a third light emitter for generating light having a third peak wavelength and a third dominant wavelength, wherein, when the first light emitter is viewed from above, the first P-type semiconductor layer includes at least four linear edges, and at least three round edges having curved shapes, and the linear edges and the round edges are alternately arranged, wherein a first peak difference value, which is an absolute value of a difference between the second peak wavelength and the first peak wavelength, is smaller than a second peak difference value, which is an absolute value of a difference between the third peak wavelength and the second peak wavelength, and wherein the second peak wavelength is greater than the first peak wavelength, and the third peak wavelength is greater than the second peak wavelength.

16. The light-emitting module of claim 15, wherein a first dominant difference value, which is an absolute value of a difference between the second dominant wavelength and the first dominant wavelength, is greater than the first peak difference value.

17. The light-emitting module of claim 15, wherein a second dominant difference value, which is an absolute value of a difference between the third dominant wavelength and the second dominant wavelength, is smaller than the second peak difference value.

18. The light-emitting module of claim 15, wherein a third dominant difference value, which is an absolute value of a difference between the third dominant wavelength and the first dominant wavelength, is smaller than a third peak difference value, which is an absolute value of a difference between the third peak wavelength and the first peak wavelength.

19. A light-emitting module, comprising:

a base substrate; and a group of light emitters disposed on the base substrate to generate light, wherein the group of light emitters include:

a first light emitter for generating light having a first peak wavelength and a first dominant wavelength, wherein the first light emitter includes a first P-type semiconductor layer and a first N-type semiconductor layer disposed on the base substrate;

a second light emitter for generating light having a second peak wavelength and a second dominant wavelength, wherein the second light emitter includes a second P-type semiconductor layer and a second N-type semiconductor layer sequentially stacked from the base substrate; and a third light emitter for generating light having a third peak wavelength and a third dominant wavelength, wherein, when the first light emitter is viewed from above, the first P-type semiconductor layer includes at least four linear edges, and at least three round edges having curved shapes, and the linear edges and the round edges are alternately arranged, and wherein a first dominant difference value, which is an absolute value of a difference between the second dominant wavelength and the first dominant wavelength, is smaller than a second dominant difference value, which is an absolute value of a difference between the third dominant wavelength and the second dominant wavelength, and wherein the second dominant wavelength is greater than the first dominant wavelength, and the third dominant wavelength is greater than the second dominant wavelength.

20. The light-emitting module of claim 19, wherein the first light emitter further includes a first substrate connected to the first N-type semiconductor layer, and when the first light emitter is viewed from above, an edge of the first substrate is spaced apart from an edge of the first N-type semiconductor layer and surrounds the edge of the first N-type semiconductor layer.

* * * * *